United States Patent [19]

Ryan

[11] Patent Number: 4,479,214

[45] Date of Patent: Oct. 23, 1984

[54] SYSTEM FOR UPDATING ERROR MAP OF FAULT TOLERANT MEMORY

[75] Inventor: Philip M. Ryan, Hopewell Junction, N.Y.

[73] Assignee: International Business Machines Corporation, Armonk, N.Y.

[21] Appl. No.: 388,832

[22] Filed: Jun. 16, 1982

[51] Int. Cl.³ .............................................. G06F 11/10
[52] U.S. Cl. ..................................... 371/11; 365/200; 371/2; 371/38
[58] Field of Search ........................ 371/38, 11, 21, 2; 365/200

[56] References Cited

U.S. PATENT DOCUMENTS

| | | | |
|---|---|---|---|
| 3,644,902 | 2/1972 | Beausoleil | 365/200 |
| 3,659,088 | 4/1972 | Boisvert | 371/21 X |
| 3,897,626 | 8/1975 | Beausoleil | 365/200 X |
| 4,174,537 | 11/1979 | Chu et al. | 371/38 X |
| 4,291,389 | 9/1981 | Toth | 365/200 X |

OTHER PUBLICATIONS

Beausoleil, Maintenance for Memory with Error Correction, IBM Technical Disclosure Bulletin, vol. 11, No. 12, May 1969, pp. 1692-1693.
Ryan, Fault Realignment Through Grouping of Compatible Faulty Memory Chips, IBM Technical Disclosure Bulletin, vol. 26, No. 6, Nov. 1983, pp. 2753-2754.
Singh et al., Word Line, Bit Line Address Interchange, etc., IBM Technical Disclosure Bulletin, vol. 26, No. 6, Nov. 1983, pp. 2747-2748.

Primary Examiner—Charles E. Atkinson
Attorney, Agent, or Firm—Richard E. Cummins; Robert J. Haase

[57] ABSTRACT

An online system is disclosed for mapping errors into an error map as data is transferred between a CPU and a relatively large fault tolerant semiconductor memory system without interfering with the normal use of the memory. The error mapping system permits a fault alignment exclusion mechanism to develop permute vectors which realign pair faults that were located at the same memory address. Having an up-to-date fault map which reflects the current error status of the memory when it is online and which reflects errors based on user data patterns greatly enhances the memory system and facilitates fault alignment exclusion efficiency.

8 Claims, 5 Drawing Figures

SYSTEM FOR UPDATING ERROR MAP OF FAULT TOLERANT MEMORY

DESCRIPTION

BACKGROUND OF INVENTION

Field of the Invention

This invention relates in general to fault tolerant memory systems and, in particular, to an improved system and method for maintaining an accurate, up-to-date map of defective bit positions in the memory during actual use of the memory in its working environment.

Cross-Referenced Applications

Application Ser. No. 388,834, filed concurrently herewith and assigned to the assignee of the present invention, describes a fault tolerant memory system in which fault alignment exclusion is provided by (1) data steering logic connected between the memory and the multi-word buffer and/or (2) memory address permutation logic to effectively rearrange the chip addresses in the chip column associated with the defective bit position.

Application Ser. No. 388,833, filed concurrently herewith and assigned to the assignee of the present invention, is directed to complement-recomplement and exclusive ORing techniques, for correcting errors and avoiding combinations of mapped faults in the same ECC word, for use with a fault tolerant memory system of the type described in application Ser. No. 388,834 which insures that previously paired chips that resulted in an uncorrectable error will not be similarly aligned at some future time by the realignment process.

Application Ser. No. 388,830, filed concurrently herewith and assigned to the assignee of the present invention, is directed to a method for storing data in a fault tolerant memory system in which the data portion of the word is stored in either the true or complement form while the check byte portion is always stored in true form to reduce the number of words read from memory that contain more errors than can be corrected by the ECC system.

Application Ser. No. 388,831, filed concurrently herewith and assigned to the assignee of the present invention, is directed to a fault tolerant memory system of the type described in application Ser. No. 388,834 which includes means for transferring the data from each memory chip associated with the memory column which has been detected as containing a defective bit position to other chips in the same column. The data transfer involves addressing the defect column with the old permute address and reading data to a buffer and writing data from the buffer back to the chips in the same column using a new permute address.

Description of the Prior Art

Large scale semiconductor memories which comprise a matrix arrangement of individual 64K bit chips generally involve chips which have one or more defective storage locations. Various arrangements are employed to insure that the arrangement of these chips are such that no one memory address contains more defective locations than the number of errors that are correctable by an associated error correcting system. If the system has a single-bit error correcting system, then a mechanism will be provided to insure that each usable memory address has no more than one defective location. One mechanism suggested by the prior art is to skip any memory address containing two or more defects. Another method which may be employed is referred to as fault realignment which is a technique to swap one or more of the defective components supplying data at the address for a non-defective component at an address which is supplied by no other defective components.

Because of the matrix arrangement of the system, the alignment process merely involves swapping positions which are in the same column. Also, because a column generally includes an addressable array of a plurality of chips, for example, 16, 32 or 64, systems may implement the swapping technique at the chip level by modifying or permutating the chip address for the column containing the defective location to be moved.

Since uncorrectable errors disrupt system performance, it is advantageous to provide systems with a mechanism which will move or realign a newly discovered error that arises during use of the memory in the field when the new error causes an uncorrectable situation, that is, when a new error is aligned at a memory address which previously contained a fault. The effectiveness of the realignment mechanism depends to a very large extent on the amount of data that exists as to defective positions at the various memory addresses and to the currency of that information since the realignment must avoid creating another uncorrectable error. It is, therefore, very desirable to provide in connection with a memory system of the above type a system for developing a fault map which is updated as each fault arises, whether or not it immediately aligns with other faults. Also, the system may have the ability to classify types of faults that occur and periodically characterize a chip or section of a chip as to how it should be considered in the realignment process.

SUMMARY OF THE INVENTION

In accordance with the present invention, a memory system is provided with an error data collecting system which comprises a counter for each bit position of the data word along with one additional counter which functions to count the number of accesses that are made to a range of memory addresses which correspond, for example, to a section of a memory chip. In accordance with the present invention, logic is provided between the ECC system and the input of the error counters to increment each bit counter corresponding to the bit position of the error, provided that other logic associated with the memory address means determines that the current address is within a predefined range of interest. That latter logic also functions to increment the access counter to count the number of memory accesses that are made to memory addresses within the selected range during a sampling period.

An error memory is connected to the output of the counters so that, at the end of a sampling period, the error data and number of accesses made can be transferred to one address of the error memory. The sampling period in the preferred embodiment is determined by some predetermined number of accesses so that the access counter determines when data is transferred from the error counters to the error memory. The error memory includes at least a number of addresses or storage positions to store error data for each of the different preselected address ranges or sections of interest to the main memory. Suitable control logic is provided, such as a programmed microprocessor, to coordinate the above described functions, control the various interactions, and to provide the desired sequence of operations.

A modification to the system is also disclosed in which periodically the memory is "scrubbed" to eliminate soft errors which may have been caused, for example, by alpha particles striking the memory chips. Since, in the scrubbing process, each position in memory or section of memory, is read out sequentially, the number of accesses is known and fixed. Therefore, the number of accesses need not be counted and the access counter may be eliminated or bypassed. Further, the size and nature of the error map may be reduced since, at the end of each section being scrubbed, sufficient data is available to classify each chip section into one of four or five fault categories which requires considerably less memory space than the error counts per se.

It is, therefore, an object of the present invention to provide an improved memory system in which a fault map of defective bit storage locations is maintained on a current basis.

Another object of the present invention is to provide a memory system in which memory chips or defective sections of memory chips are classified as to the type of errors they contain on a current basis.

A further object of the present invention is to provide a fault alignment exclusion system for a semiconductor memory in which error type classification of each memory chip or section of memory chip is based on data collected by sampling of the error correcting system while the memory is operating online with a data processing system.

The foregoing and other objects, features and advantages of the invention will be apparent from the following more particular description of the invention as illustrated in the accompanying drawings.

DESCRIPTION OF THE PREFERRED EMBODIMENT

Figure 1:
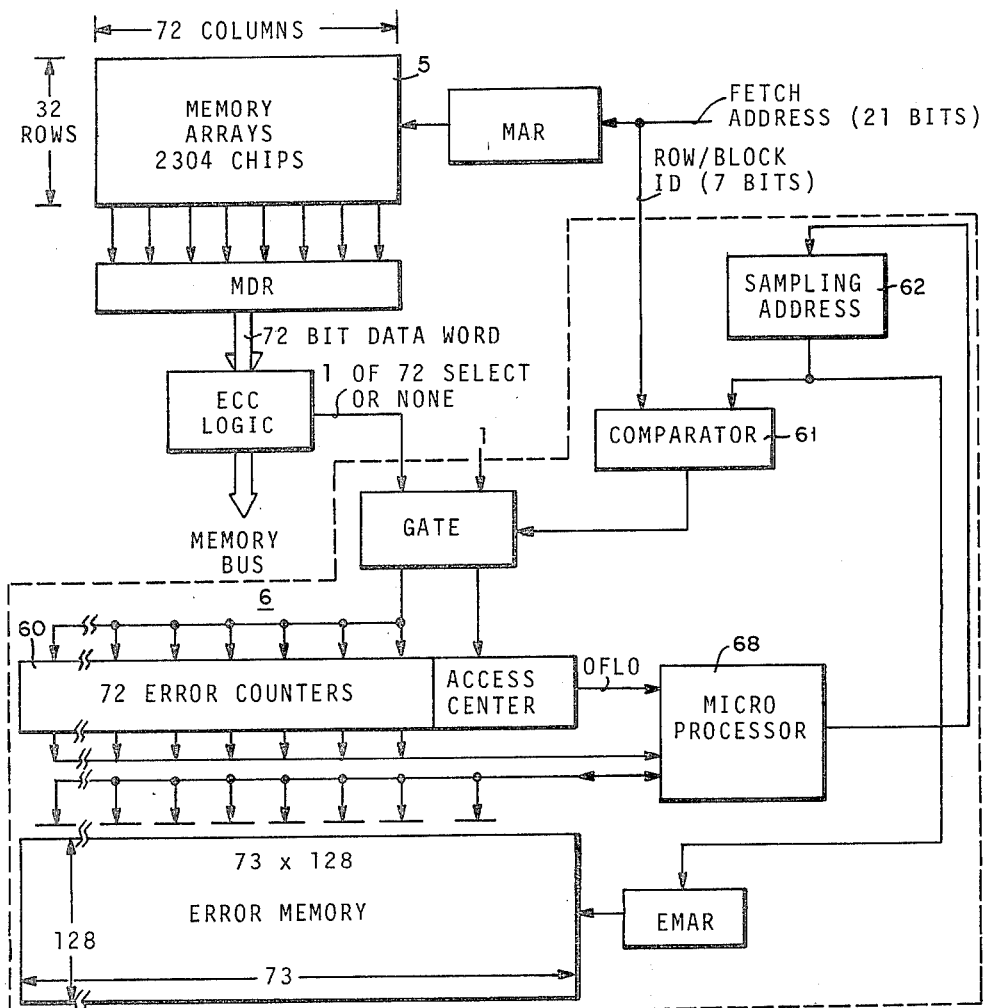
FIG. 1 is a schematic illustration of a memory system embodying an implementation of the present invention.

FIG. 1 illustrates a memory system which includes a system for maintaining a map of defects that are detected in the memory system on a current basis in accordance with the teaching of the present invention. The system, as shown in FIG. 1, includes a memory 5, an error mapping system 6 and an error correcting system 7. The ECC system functions to correct, i.e., detect, locate and correct, a single-bit error in any bit position of the 72-bit data word read from the memory 5 and to detect multiple-bit errors and their location in the word. The single-bit correcting function is automatic and employs conventionally known syndrome byte processing techniques. The details of the single-bit error correcting system are neither illustrated nor described, since any of the known prior art arrangements may be employed.

Likewise, the arrangement for double-bit error detection and the identification of the bit locations where the defects are located is also not shown or described in detail since the teachings are also well known in the art. For example, the complement/recomplement technique applied to a data word read from memory may be used to identify "stuck errors" and eliminate one of the two errors which then permits the single-bit ECC system to identify the other error. Since the corrected word and the original word may be exclusive-ORed, bit positions which are in error may be identified by the 1's which result from the exclusive-OR operation.

Figure 2:
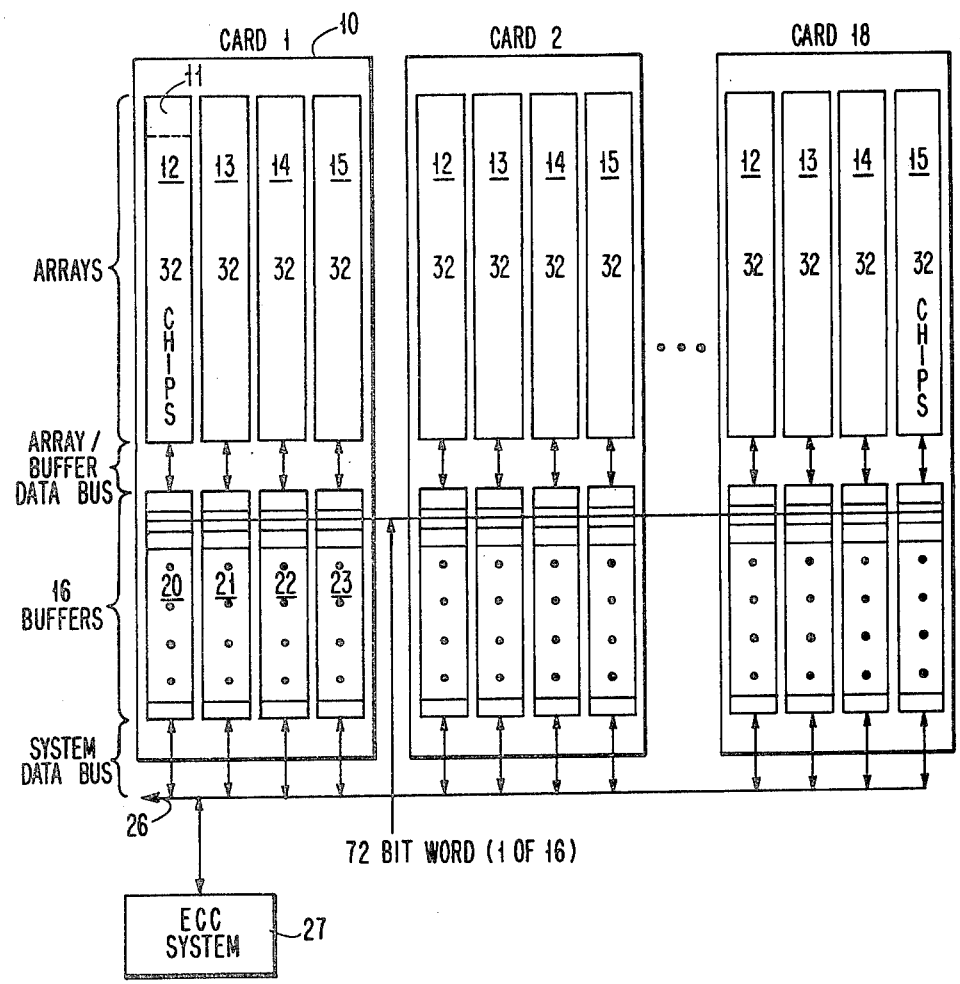
FIG. 2 is a functional block diagram of the memory array shown in FIG. 1.

The error mapping system 6 shown in FIG. 1 comprises a plurality of error counters 60, each of which is associated with a different bit position of the data word read from memory. As shown in FIG. 1, there are 72 error counters and one access counter. Logic means is associated with each counter to increment the counter if two conditions occur simultaneously. The first condition is that the memory address being read is within some predetermined range of addresses and, second, that the ECC system identifies the position of an error in the word read from that address. As shown, the first condition is determined by means of comparator 61. The sampled address register 62 is supplied to one input of the comparator 61, while a portion, e.g., 7 bits of the 21-bit fetch address supplied to the memory 5, is applied to the other input of comparator 61. The 21-bit fetch address comprises 5 bits to select one of 32 rows of the memory matrix and 16 bits to define one position on a 64K bit chip. The details of the arrangement are shown in FIG. 2 and discussed later on in the specification. The 7 bits of the sample address includes 5 bits identifying the row and 2 bits which define one-quarter or 16K chip addresses of the 64K chip addresses. The positive output of the address comparator causes the access counter to be incremented by 1 and gates any output of the ECC system to the appropriate counter when an error occurs in a word read from an address within the section of memory specified by the sample address register.

Figure 4:
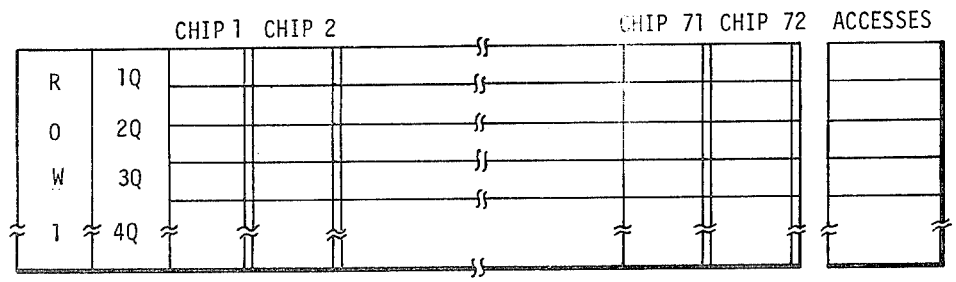
FIG. 4 illustrates the form of the data stored in the error memory shown in FIG. 1.

The error correcting system further includes an error memory which is shown in FIG. 4 as containing 73×128 individual addressable positions. The output of each error counter is associated with one column of the error memory, as is the access counter. The 128 rows of the error memory are associated with the 32 chips in each main memory array (FIG. 2) such that rows 0–3 of the error memory store error data generated by four quarter sections of the chips in row 0 of the main memory, positions 4–7 of the error memory store error data generated for the four quarter sections of the chips in row 1 of the main memory, etc. The number of accesses to each quarter section of a row, as counted by the access counter, are also stored at column 73 of the error memory. The various components of the error collection system described above are under the control of the microprocessor 68.

Figure 3:
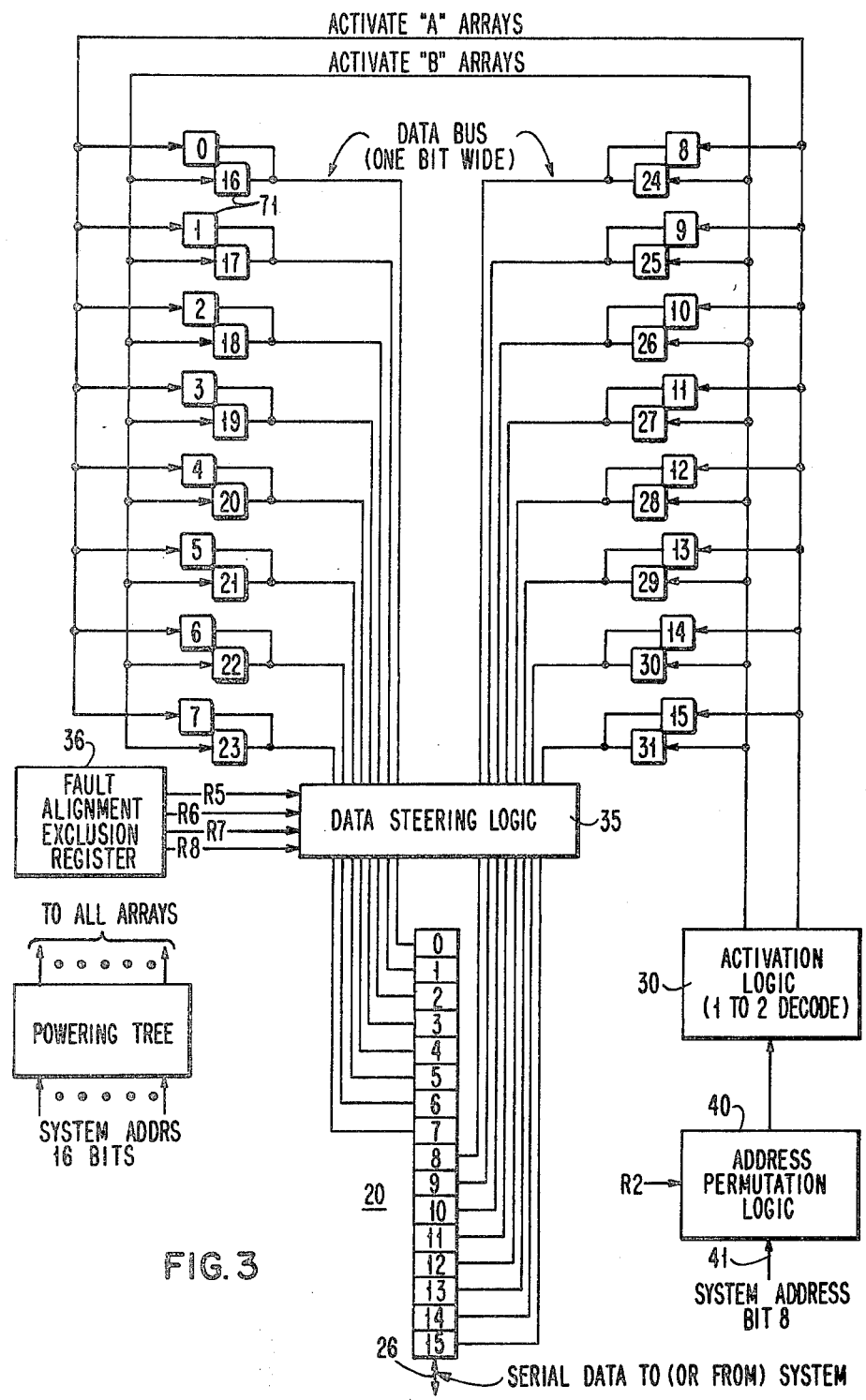
FIG. 3 illustrates in block form the data storing logic as it is embodied in each of the 72 channels shown in FIG. 2.

The main memory array as shown in FIGS. 2 and 3 and described in detail in cross-referenced application Ser. No. 388,834, includes a fault alignment exclusion mechanism 35, 36 which functions generally to change the chip addresses in the columns to logical addresses so as to move one of the two aligned chips which each have a defect at the same address to another row in the matrix. Logical addresses of the chips in the column are determined by an address permute vector R5–R8 which is applied for example to the steering logic 35 as described in cross-referenced application Ser. No. 388,834 and which is developed by a suitable algorithm.

The realignment algorithm requires an accurate map of the faults present in memory. The acquisition of such a fault map can be a very time-consuming process involving, perhaps, hours for the entire memory. Hardware assisted fault mapping can bring down the time to generate a fault map to seconds or, at most, a few minutes. To obtain the map, the memory is quiesced, filled successively with at least two diagnostic patterns, and read repeatedly, counting errors in each section of the memory. This process is, by far, the most time-consuming part of the fault realignment procedure.

The error collection hardware shown in FIG. 1 allows an accurate fault map to be created online without requiring the user to give up his system. The mapping process can go on in the background without disturbing or interfering in any way the user's operation and can be done continuously. This allows a relatively up-to-date fault map to be available at all times, in particular, at initial program load time (IPL). Since computation of the permute vector and applying it takes mere seconds, a fault realignment process can be incorporated in every IPL or initial microprogram load step (IMPL), thus keeping the maximum number of storage pages available to the user and minimizing the costs of memory card replacement without ever taking the memory away from the user to perform a realignment.

The arrangement of the present invention has a further advantage over offline hardware assisted approaches in that, since it operates with a variety of user data in the memory, it is more likely to encounter and detect pattern dependent faults and other intermittent faults which may escape a fixed pattern diagnostic routine.

The arrangement also improves the operation of the process described in cross-referenced application Ser. No. 388,831. Single-faults which have occurred since the last fault map diagnostic without causing an alignment error are unknown when calculating the change to the permute vector. Therefore, there is some chance that the changed (new) permute vector could cause alignments with these unmapped faults. By maintaining a more current fault map, as disclosed herein, the disclosed system improves the probability that the process described in cross-referenced application Ser. No. 388,831 will produce a successful misalignment of the two faults causing the double error without introducing new unexpected alignments.

The operation of the system's error collection arrangement will now be described. It is assumed that the main memory is loaded with user data and that the data will be transferred between the memory and the CPU. Microprocessor 68 supplies a 7-bit sampling address to register 62. The address specifies an address range from 0–16K of the chips in row 0 of the memory. Each time the memory 5 is addressed within that range, the access counter is incremented by 1. If the data word read from a memory location within the range contains an error, the corresponding error counter is incremented. The contents may be 8-bits wide so that the counter counts from 0–255. The system is arranged to add the contents of each counter to the contents of the corresponding location in the error memory when the access counter cycles after 256 addresses to that section.

The microprocessor 68 controls the error memory addressing and count accumulation. After the counts have been accumulated and the counter reset to 0 for one sampled address, the next sampling address to supplied to sample register 62. The process is repeated for the second quarter section of the chips in row 0 of the main memory. The entire memory is repeatedly scanned. Since the ratio of errors to accesses for that quarter section of memory is the most important figure, the system is arranged to provide such a ratio.

Each position of the error memory for storing error counts comprises, for example, 17 bit positions. One bit position is an error flag which is set the first time there is an error in the associated section of the chip. The error flag is important since the accumulated error count stored in a position of the error memory may exceed the capacity of the storage position. The system is, therefore, arranged to check each stored value and, if the addition of the related error value would result in an overflow of that position, each stored value in the memory is shifted one place to the right. The net result is that, after the entire memory is scanned many times, the value stored in the error map really represents ratios of errors to accesses for that quarter section of memory.

There are basically four types of faults that occur in a semiconductor memory chip. These are single-cell faults, word line faults, bit line faults, and chip kill faults. It can be shown, for example, by simulation that for a given semiconductor chip technology the expected number of detected errors due to each of the four types of faults for every 1 million accesses is as follows:

| Chip Sections | Single Cell Faults | Word Line Faults | Bit Line Faults | Chip Kill | Accesses Divided by 256 |
|---|---|---|---|---|---|
| 1Q | 0 | 0 | ~2048 | ~524288 | 4096 |
| 2Q | ~32 | 0 | ~2048 | ~524288 | 4096 |
| 3Q | 0 | ~8192 | ~2048 | ~524288 | 4096 |
| 4Q | 0 | 0 | ~2048 | ~524288 | 4096 |

The ratio of detected errors to accesses divided by 256 for each of the four types of faults are substantially as follows:

| Chip Sections | Single Cell Faults | Word Line Faults | Bit Line Faults | Chip Kill |
|---|---|---|---|---|
| 1Q | 0 | 0 | ~½ | ~128 |
| 2Q | ~1/128 | 0 | ~½ | ~128 |
| 3Q | 0 | ~2 | ~½ | ~128 |
| 4Q | 0 | 0 | ~½ | ~128 |

A fault category map may be created by the microprocessor reading out the contents of the error memory and, based on previous simulations, convert the actual counts to ratio of errors to accesses, which is the basis of assigning the chip or chip sections to various categories of faults.

| Ratio of Detected Errors to Accesses Divided by 256 | Classification of this Quarter Chip |
|---|---|
| 0 and no "any fault latch" | Clean |
| $\leq 1/16$ | Scattered Cell Faults |
| 1/16 to 1 | Bit Line Fault |
| 1 to 32 | Word Line Fault |
| $\geq 32$ | Massive, Chip Kill Fault |

The new fault alignment exclusion algorithm may be used in connection with the fault category map to identify quarter chips that might be paired with the minimum possibility of creating a pair of aligned defects. Such an algorithm would follow the rules set forth in the following table and could execute quite quickly with minimum risk of creating new paired defects.

| | Chip "A" Fault Type | | | | |
|---|---|---|---|---|---|
| | Clean | Cells | Bit Line | Wordline | Massive |
| Chip "B" Fault Type | | | | | |
| Clean | a | a | a | a | a |
| Cells | a | a | a | a | x |
| Word Line | a | a | x | a | x |
| Bit Line | a | a | a | x | x |
| Massive | a | x | x | x | x | a = allowed
x = forbidden

In summary, it will be recognized that the described hardware and processes outlined above provide the capability of maintaining in real time, online, with no interruption of the user service, an accurate, up-to-date map of faults in the user's memory as seen in the user's operating environment, rather than an artificial diagnostic environment. Such an up-to-date fault map greatly simplifies troubleshooting as well as facilitating fault alignment exclusion, either automatically or by operator action. Since the mapping is done without interruption of the user's service, it can be done all the time without requiring a user perceived interruption of service to purge the memory of user data, load test patterns and run diagnostic tests.

Figure 5:
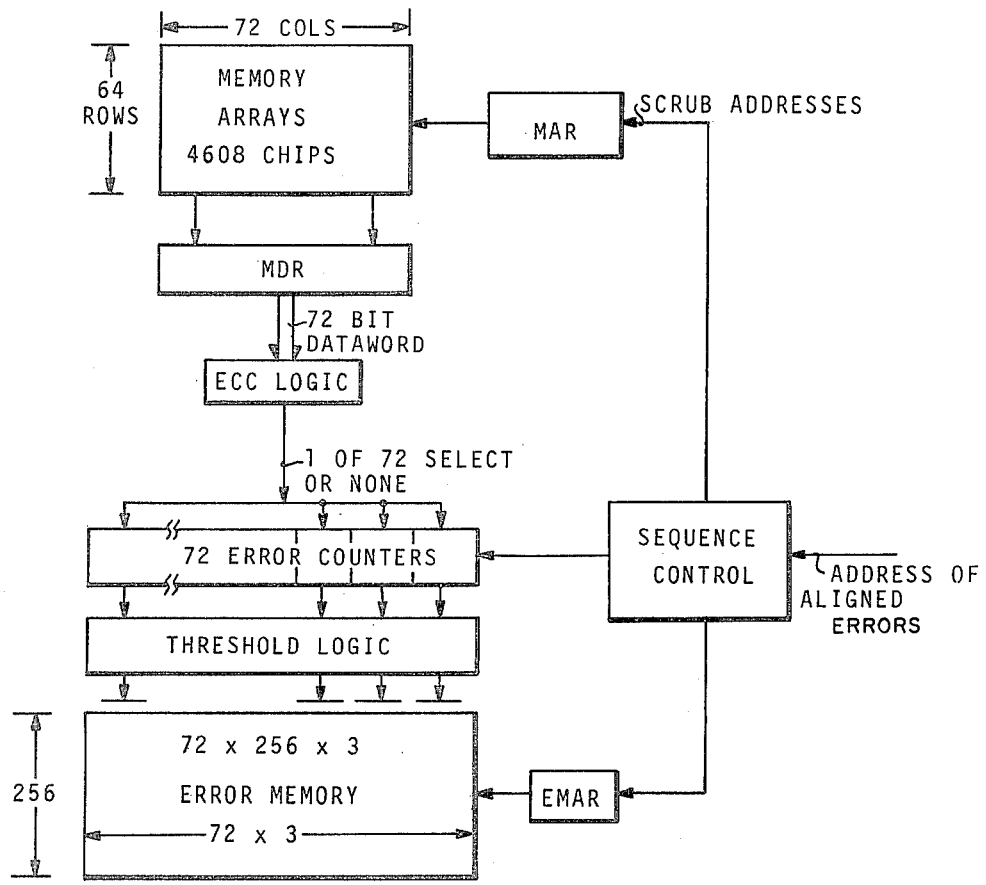
FIG. 5 illustrates the modification of the system shown in FIG. 1.

FIG. 5 shows a modification of the system shown in FIG. 1 in which online background mapping is employed. The system shown in FIG. 5 differs from that shown in FIG. 1 in that the fetch address is replaced by a "scrub address".

The concept of a background scrubbing operation for memories which are subjected to intermittent faults is well known in the art. The basic concept is based on the premise that if the entire memory is read out periodically through the error correcting system, soft errors which have occurred in locations of the memory will, in effect, be corrected. The entire scrubbing operation, therefore, reduces the possibility of any given word that is stored in memory from accumulating two soft errors which would cause an uncorrectable error for the system.

The scrub address, as shown in FIG. 5, therefore, basically is an address supplied from the sequence controller which causes the entire memory to be read out in sequence. The sequential reading out of the memory may be interrupted by the higher priority user accesses to the memory, but eventually, the entire memory is read out, tested, and addresses containing single soft errors rewritten with correct data.

The system of FIG. 5 also differs from the system of FIG. 1 in that the access counter is omitted since the sequence controller supplies the same number of addresses for each quarter section of the memory, and hence, that number is a constant.

The system of FIG. 5 further differs from the system of FIG. 1 in that the sampling address 62 and the comparator 61 logic is omitted since the sequence of addresses used by the scrubbing operation is not important as long as all addresses of the memory are visited in a timely fashion. Therefore, the scrubbing of one row is achieved and the error memory updated for that row. The next area of interest is then scrubbed.

The sequence controller provides the scrub addresses and determines the row which is of interest.

The sequencer, as shown in FIG. 5, may be arranged to repeatedly read out, for example, 16 times the one quarter section of the chip whose address is determined by the scrub address supplied to the memory address register. Since the scrubbing operation is periodically interrupted by the user supplying and changing data stored in that quarter section of memory, it is possible to, based on the results of the 16 sequential scans of that quarter section of the memory, determine the different fault types that are in the respective chips. If the total number of errors detected after 16 passes from the quarter section of the chip is in the range of 0-1 errors, the quarter chip is classified as being clean. If the total count is 2-63, the chip is classified as having random defective cells. If the count is from 64-1023, the chip is classified as having a bit line fault. If the number is 1024-4095, the chip is classified as having a word line fault. If the accumulated amount is greater than 4096, the chip is classified as a chip kill. The system is arranged such that after 16 passes through each one quarter chip, the counts are thresholded as indicated above and the 72 one quarter chips are classified as indicated. The classification is then recorded in one of the 256 lines and the error memory encoded as 3 bits per quarter chip. The sequence controller then resets the counters and begins scrubbing the next quarter chip segment of the memory. In the absence of higher priority reads and writes by the system, scrubbing would take less than 20 milliseconds per quarter chip segment or less than 5 seconds for a 16 megabyte basic storage module.

One additional feature of the arrangement shown in FIG. 5 is that, since the appearance of one or more aligned errors shows the recent appearance of a new fault in memory, it is advantageous to make sure that the new fault gets into the fault map. Accordingly, when an error is identified as caused by two hard faults, the sequence controller is interrupted and the address of the error containing two hard faults is supplied to the sequencer. The sequence controller scrubs and maps the four quarter chip segments of that chip row, taking in the neighborhood of 200 milliseconds to assure that the latest faults appear in the map. The time to complete the map is probably comparable to the time needed by the operator of the system to respond to the double error.

While the invention has been particularly shown and described with reference to a preferred embodiment thereof, it will be understood by those skilled in the art that various other changes in the form and details may be made therein without departing from the spirit and scope of the invention. For example, in FIG. 1, the 72 hardware counters may be reduced to four counters and the error counting function operated on 18 separate vertical sections, each havng four vertical columns. The time required to scan the memory for error counts would, however, be increased. Also, the counters, if desired, may be replaced by using memory locations in the microprocessor 68 in FIG. 1.

Having thus described my invention, what I claim as new and desire to secure by Letters Patent is:

1. A memory system having a number of memory chips arranged in a matrix of N rows and M columns for storing X data words per roll having M bit positions, X being greater than N, said system comprising:

addressing means for reading said data words from said matrix, an error checking system for identifying and locating error in any bit of each said data word read from said matrix, control means for establishing a range Y of memory addresses, Y being a fraction of X but greater than N, counter means associated with respective bits of each said data word read from said matrix, logic means connected to said control means, said error checking system, said addressing means and said counter means and operative to increment one of said counter means each time that error is identified in a respective bit of a data word having an address within said range, an additional counter connected to said logic means, said additional counter being incremented each time a data word is read from said matrix within said range Y of memory addresses irrespective of whether error is identified in any bit thereof, and means connected to said counter means and said additional counter to determine the ratio of the counts in each said counter means relative to the count in said additional counter.

2. The memory system recited in claim 1 in which said counter means comprises M counters.

3. The memory system recited in claim 1 in which Y equals one fourth of X.

4. The memory system recited in claim 1 and further comprising an error memory connected to said control means, said error memory having a number of storage positions equalling the product of the reciprocal of said fraction and said number.

5. The memory system recited in claim 4 wherein said error memory accumulates error counts in each of said product number of storage positions.

6. The memory system recited in claim 1 and further comprising means included within said control means for changing said memory addresses.

7. The memory system recited in claim 6 wherein said memory addresses are changed so as to cover all of said ranges Y of said memory addresses constituting said memory system.

8. The memory system recited in claim 1 and further including a fault alignment exclusion mechanism responsive to a permute vector, said ratio of the counts being utilized in developing said permute vector.

* * * * *